United States Patent [19]

Lebedev et al.

[11] 4,044,219
[45] Aug. 23, 1977

[54] METHOD AND APPARATUS FOR CONTROLLING FLASHING SPEED DURING RESISTANCE BUTT WELDING

[76] Inventors: Vladimir Konstantinovich Lebedev, ulitsa Engelsa, 25, kv. 12; Ivan Alexeevich Chernenko, ulitsa Vladimirskaya, 98/3, kv. 45, both of Kiev; Nikolai Ivanovich Postolaty, ulitsa K. Marxa, 68, kv. 45, Kakhovka Khersonskoi oblasti; Sergei Ivanovich Kuchuk-Yatsenko, ulitsa Filatova, 1/22, kv. 47; Vladimir Ivanovich Tishura, ulitsa Chigorina, 55, kv. 27, both of Kiev; Yakov Borisovich Entin, ulitsa Chernyakhovskogo, 3, kv. 5, Kolomna Moskovskoi oblasti; Alexandr Nikolaevich Filippov, ulitsa Lenina, 42, kv. 52, Kolomna Moskovskoi oblasti; Evgeny Petrovich Martynov, ulitsa Kalinina, 24, kv. 47, Kolomna Moskovskoi oblasti, all of U.S.S.R.

[21] Appl. No.: 622,394

[22] Filed: Oct. 14, 1975

[51] Int. Cl.² ............................................. B23K 11/04
[52] U.S. Cl. ........................................ 219/100; 219/97; 219/101; 219/104
[58] Field of Search ................. 219/97, 100, 101, 104, 219/110, 87

[56] References Cited

U.S. PATENT DOCUMENTS

| | | | |
|---|---|---|---|
| 3,151,290 | 9/1964 | Riley et al. | 219/110 |
| 3,296,409 | 1/1967 | Schwartz | 219/87 |
| 3,335,257 | 8/1967 | Sakharnov et al. | 219/101 |
| 3,748,431 | 7/1973 | Melbard et al. | 219/97 |

FOREIGN PATENT DOCUMENTS

| | | | |
|---|---|---|---|
| 129,757 | 10/1960 | U.S.S.R. | 219/97 |

OTHER PUBLICATIONS

John J. D'Azzo et al., Feedback Control System Analysis & Synthesis, 1960, pp. 404-407.
V. G. Krivenko et al., "A Drive Motor Speed Regulator for Flash Welding Machines", Avt. Svarka, 1972, No. 1, p. 75.

*Primary Examiner*—J. V. Truhe
*Assistant Examiner*—Clifford C. Shaw

[57] ABSTRACT

A method for controlling flashing speed during resistance butt welding comprises measuring values of current density for at least two joints between parts being welded, converting them into d-c. voltages, detecting a maximum voltage value, comparing it to a preset d-c. voltage, the resultant difference value being used as flashing speed control parameter. An apparatus for carrying out the method comprises electric circuits whose number is equal to the number of joints being welded. Each circuit comprises a welding transformer and a circuit for conversion of flashing current density into d-c. voltage. A maximum signal detector comprises circuits for conversion of current density into d-c. voltages, whose number is equal to the number of joints being welded. The detector output is connected to the circuit for comparing a current voltage value to the preset one. The apparatus according to the invention may be used mainly for controlling flashing speed during concurrent resistance butt welding of several joints of large and different respective cross-sectional areas.

3 Claims, 3 Drawing Figures

METHOD AND APPARATUS FOR CONTROLLING FLASHING SPEED DURING RESISTANCE BUTT WELDING

The present invention relates to the field of resistance butt welding with continuous flashing, and more particularly to a method and apparatus for controlling flashing speed during resistance butt welding. The apparatus and method may be used for controlling flashing speed during concurrent resistance butt welding of at least two joints having large and, preferably, different respective cross-sectional area.

Known methods and apparatus for controlling flashing speed enable the control of this parameter only in welding one joint. Concurrent welding of several joints was used heretofore only in welding parts having small cross-sectional areas. In such cases, the welding is conducted in accordance with a preset flashing speed control programme so that an apparatus for operation by this method usually has a great power input margin. The employment of such apparatus for concurrent welding of joints having large cross-sectional areas is practically impossible due to exceptionally high power input values. The use of an apparatus with high flashing voltage results in non-uniform heating of the end portions of the parts being welded, as well as in the formation of end craters thus leading to low quality of weld joints.

Continuous expansion of the scope of application of the resistance butt welding technique requires the provision of new highly efficient methods and apparatus for controlling the flashing process which should ensure stable heating of the parts being welded, and hence high quality of weld joints. Thus, in performing resistance butt welding of crankcases of powerful diesel engines, where it is necessary to effect concurrent welding of five joints having respective large cross-sectional areas of about 50,000 mm², the flashing speed control enables the concurrent conduct of welding of all joints, improves productivity, labor conditions and the quality of manufactured products.

Known in the art are systems for effecting rigid control of relative displacement of parts during the flashing in accordance with a preset program. These systems do not react on many of the disturbances and thus affect the flashing process negatively and causing short circuits in the joints and appearance of flaws leading to failure of the product.

The use of a control system ensuring the control of the speed of movement of the parts being welded in accordance with a preset program is expedient in welding thin-walled parts having respective small cross-sectional areas, where the flashing occurs with a large stability margin. Various programs for controlling the flashing speed are usually set up by means of cam mechanisms. The rotational speed and shape of the cam determine the flashing speed. This method for controlling flashing speed is very simple. This method is, however, inapplicable in welding parts having respective large corss-sectional areas. Welding various parts with different preparation of end faces by this method is complicated, because the selection of the welding conditions, that is flashing speed, requires changing the cam profile.

It is known to use an apparatus for carrying out a method for controlling flashing speed comprising a motor time relay.

In this case, the control is effected in accordance with a rigid program which is applicable only for parts having small cross-sectional areas. An increase in the applied power results in the formation of flaws as mentioned above.

Known in the art is a method for controlling flashing speed during resistance butt welding comprising controlling the flashing speed in accordance with a parameter measured in the welding zone.

Known in the art is an apparatus for controlling flashing speed during resistance butt welding comprising a welding transformer having a secondary winding located directly adjacent to the joint being welded, and connected thereto and a primary winding connected to an a-c. voltage source, and electrically connected to a secondary winding of a current transformer which is connected to a primary winding of a matching transformer having a secondary winding electrically connected to a comparator unit for comparing a current voltage value to the preset, and having an output connected to an electric motor of a drive for displacing the parts being welded.

The above-described method for controlling flashing speed comprises measuring the flashing current, converting it into a d-c. voltage, comparing it to a preset voltage and acting with the resultant difference value on the flashing speed.

The operation of the apparatus for carrying out the above-described method is based on comparison of two voltages: a voltage proportional to an admissible range of variation of the flashing current and a voltage proportional to a current value of the flashing current.

The apparatus for controlling flashing speed during resistance butt welding enables the welding of parts having large respective cross-sectional areas, while ensuring a high quality of weld joints. In addition, the above-described method enables the welding of parts of various metals and alloys, such as titanium and aluminum alloys, and various grades of steel. However, this method does not provide for concurrent welding of several joints having respective large cross-sectional areas. In addition, the control system cannot provide for forced elimination of any play between parts and any lost-motion zones.

It is an object of the invention to provide a method for controlling flashing speed during resistance butt welding which enables concurrent welding of several joints having respective large cross-sectional areas.

Another object of the invention is to provide an apparatus for controlling flashing speed during resistance butt welding for concurrent welding of several joints.

Still another object of the invention is to provide an apparatus for controlling flashing speed which ensures a forced elimination of any play between parts and any lost-motion zones of welding installations having complicated force transmission arrangements.

A further object of the invention is to improve the stability of the control process during concurrent welding of several joints.

These objects are accomplished by a method for controlling flashing speed during resistance butt welding including the step of controlling the flashing speed in accordance with a parameter measured in the welding zone, according to the invention, the method comprising measuring the values of flashing current density for at least two joints of the parts being welded, converting these values into d-c. voltages, detecting a maximum d-c. voltage value and comparing it to a preset d-c.

voltage, the resultant difference value being used as flashing speed control parameter.

A time derivative of the maximum d-c. voltage value is preferably determined for controlling the flashing speed by means of the derivative value along with the difference value.

The above objects are also accomplished in an apparatus for controlling flashing speed during resistance butt welding comprising a welding transformer having a secondary winding located directly adjacent to the joint being welded and connected thereto, and a primary winding connected to an a-c. voltage source and electrically connected to a secondary winding of a current transformer which is connected to a primary winding of a matching transformer having a secondary winding electrically connected to a comparison circuit for comparing a current voltage value to the preset one having an output connected to an electric motor of a drive for displacing the parts being welded, according to the invention, the electric coupling of the secondary winding of the matching transformer to the comparison circuit for comparing a current voltage value to the preset one comprises a series circuit including a circuit for conversion of the flashing current into current density and a maximum signal detector which comprises a circuit for conversion of current density into d-c. voltage, there being provided at least one additional series circuit including a welding transformer having a secondary winding connected to another joint being welded and a primary winding connected to said a-c. voltage source, a current transformer, a matching transformer, a circuit for conversion of the flashing current into current density having an output connected to the input of the circuit for conversion of current density into d-c. voltage incorporated in the circuit of the maximum signal detector and electrically coupled to the main circuit for conversion of current density into d-c. voltage, the number of circuits being equal to the number of joints being welded.

The apparatus preferably comprises a differentiating member having an input connected to the output of the maximum signal detector and an output connected to the input of the comparison circuit for comparing a current voltage value to the preset one.

The use of the method and apparatus for controlling flashing speed according to the invention enables concurrent resistance butt welding of articles having several joints of large and different respective cross-sectional areas. Commercial introduction of the new method of welding crankcases of cylinder blocks of powerful diesel engines permits lowering the production cost of crankcases by 18 times as compared To manual arc welding used heretofore with an increase in labor productivity by more than 70 times. A preset program for controlling flashing speed which is automatically executed ensures high quality of the welded parts.

The invention will be described with reference to a specific embodiment thereof illustrated in the accompanying drawings, in which.

Figure 1:
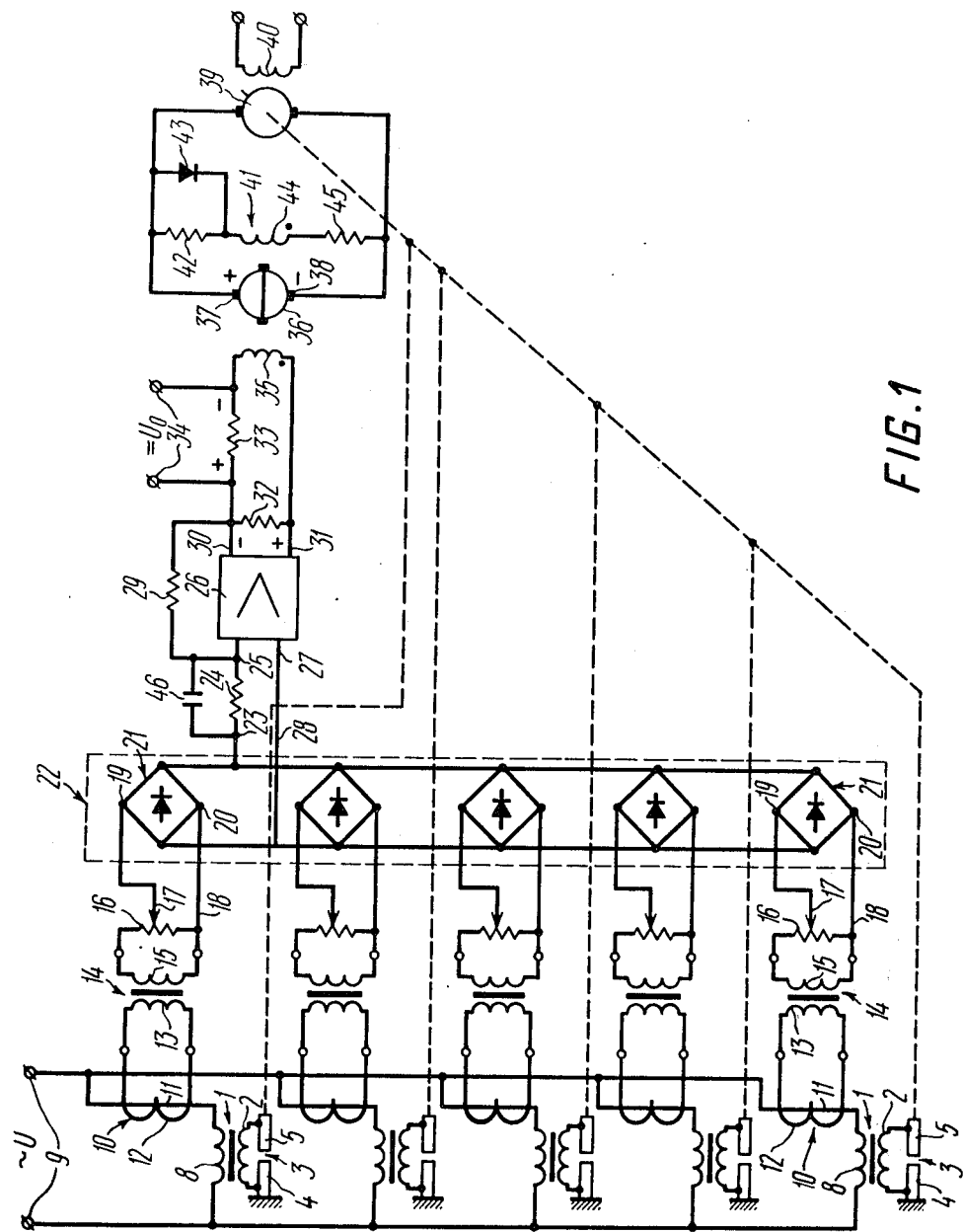
FIG. 1 shows a wiring diagram of the apparatus for controlling flashing speed during the welding of five joints according to the invention.

The apparatus for controlling flashing speed during resistance butt welding in the embodiment herein described comprises five welding transformers 1 (FIG. 1) corresponding to the number of joints to be welded. A secondary winding 2 of each transformer 1 is located directly adjacent to a joint 3 being welded and connected to two parts 4 and 5 of an article being welded.

Figure 2:
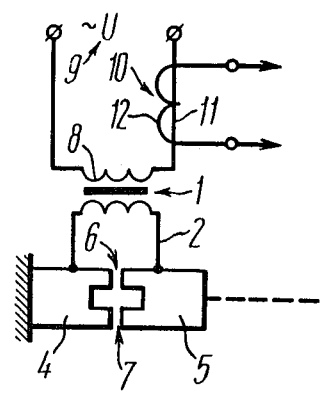
FIG. 2 shows an embodiment of connection of the secondary winding of the welding transformer to two adjacent joints of an article being welded, according to the invention.

Alternatively, one welding transformer 1 can be used per two joints 6 and 7 being welded (FIG. 2). This is possible in case the cross-sectional areas of the respective joints 6 and 7 is small and the joints are located close to each other.

A primary winding 8 (FIG. 1) of each welding transformer 1 is connected to an a-c. voltage source 9.

The apparatus also comprises five current transformers 10 in accordance with the number of the welding transformers 1.

A primary winding 11 of each current transformer 10 is formed by a conductor used for connecting the welding transformer 1 to the a-c. voltage source 9. Secondary windings 12 of the current transformers 10 are connected to primary windings 13 of respective matching transformers 14. A secondary winding 15 of each matching transformer 14 is connected to a respective matching resistor 16 with a movable current collector 17. The position of the movable current collector 17 is set up in accordance with the cross-sectional area of the joint 3 being welded.

The matching resistor 16 with the movable current collector 17 forms a circuit for conversion of the flashing current into current density.

The conductor 18 from the matching resistor 16 and the movable current collector are connected to terminals 19 and 20 of the input diagonal of a single-phase rectifier bridge 21. The rectifier bridge 21 forms a circuit for conversion of current density into d-c. voltage. Generally, the number of the rectifier bridges 21 is equal to the number of the welding transformers 1. The output diagonals of the rectifier bridges 21 are connected in parallel with one another. The combination of the rectifier bridges 21 forms a maximum signal detector 22.

Generally, the number of inputs of the maximum signal detector 22 is equal to the number of the welding transformers 1.

An output 23 of the maximum signal detector 22 is connected, via a resistor 24, to an input 25 of a voltage amplifier 26. The other input 27 of the voltage amplifier 26 is connected to an output 28 of the maximum voltage detector 22.

In this embodiment, the voltage amplifier 26 comprises an operational d-c. amplifier built around a conventional circuit and looped with a negative feedback including a resistor 29.

Figure 3:
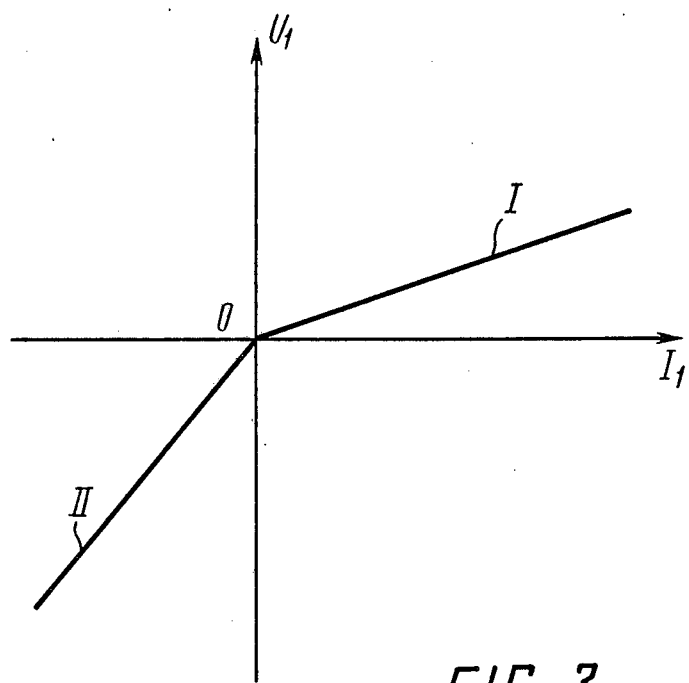
FIG. 3 shows a static characteristic of the dependence of voltage $U_1$ at the output of an amplidyne vs current $I_1$ flowing in the control winding of the amplidyne which is inserted in the comparator circuit of the apparatus according to the invention.

Outputs 30 and 31 of the voltage amplifier 26 are loaded with a load resistor 32. The load resistor 32 forms a closed series circuit with a resistor 33 which is connected to a voltage source 34 supplying a preset reference voltage $U_o$ and to a control winding 35 of an amplidyne 36. This circuit represents a comparison circuit for comparing a current voltage value to the preset one. Outputs 37 and 38 of the amplidyne 36 are connected to an electric motor 39 of a drive for displacing the parts being welded. A winding 40 is an independent field winding of the electric motor 39. A parallel-series circuit 41 including a resistor 42, a rectifier 43, a control winding 44 of the amplidyne 36 and a resistor 45 is connected to the outputs 37 and 38 of the amplidyne 36 to form a negative feedback. The polarity of connection of the rectifier 43 is determined by the voltage polarity across the outputs 37 and 38 of the amplidyne 36. Thus the amplidyne 36 looped with a non-linear negative feedback has a static characteristic shown in FIG. 3. The characteristic is flat — portion 1 — in the direction of bringing together the parts 4 and 5 being welded (FIG. 3), and steep — portion II — in the direction of moving apart the parts 4 and 5 being welded (FIG. 1).

A capacitor 46 is connected in parallel with the resistor 24, the capacitor serving as differentiating member for differentiating maximum signal.

The apparatus for controlling flashing speed during resistance butt welding according to the invention functions in the following manner.

The parts 4 and 5 of an article being welded are placed in the welding machine in such a manner as to provide a certain gap between the surfaces of the parts 4 and 5 to be welded.

A supply voltage is fed to the amplifier 26, the field winding 40 of the electric motor 39 of the drive for displacing the parts 4 and 5 being welded and the amplidyne drive 36. An a-c. voltage U is fed to the primary windings 8 of the welding transformers 1 so as to make flashing circuits whose number is equal to the number of the welding transformers 1. A preset voltage $U_o$ which represents an analog of the preset flashing current density is fed to the resistor 33.

Thus, a current proportional to the voltage $U_o$ flows in the control winding 35 of the amplidyne 36. A voltage of a value determined by the value of the signal fed to the input of the amplidyne and by the negative feedback ratio of the amplidyne 36 appears at the inputs 37 and 38 of the amplidyne. Thus the armature of the electric motor 39 (not shown) is energized. The parts 4 and 5 of the article being welded are brought together.

The control circuit remains open until the the parts 4 and 5 are in contact so that the signal $U_o$ is the value determining the speed of movement of the parts 4 and 5 towards one another.

Upon engagement of the parts 4 and 5 of the article at any of the joints 3, e.g. at the first joint, a current starts flowing in the flashing circuit and in the primary winding 8 of the welding transformer 1. A signal appears in the secondary winding 12 of the current transformer 10 which is fed, via the matching transformer 14, to the matching resistor 16.

Since the matching resistor 16 is adjusted to a preset cross-sectional area of the joint 3, a voltage appears across the resistor 16 which is proportional to the flashing current density.

If the parts being welded are in contact with one another at several joints or at all five joints 3 at the same time, voltage proportional to the flashing current densities in the joints 3 appear across the respective matching resistors 16.

These voltages are fed to the rectifier bridges 21 of the maximum signal detector 22 to be converted therein into d-c. voltages. In accordance with the maximum flashing current density which appeared at any of the joints 3, a maximum d-c. voltage is detected in one of the rectifier bridges 21. This voltage blocks-off the remaining rectifier bridges 21 of the maximum signal detector 22, and is fed to the inputs 25 and 27 of the voltage amplifier via the resistor 24 and the differentiating member 46.

Thus, a voltage appears across the resistor 32 of the voltage amplifier 26 which is proportional to the total sum of the maximum flashing current density at any of the joints 3 and the time derivative of this maximum flashing current density.

The voltage across the resistor 32 of the amplifier 26 is inserted in opposition to the voltage $U_o$ corresponding to the preset current density in the circuit of the control winding 35 of the amplidyne 36. Therefore, the current flowing in the winding 35 is proportional to the difference between the preset flashing current density and the current value of maximum flashing current density.

If the current value of the maximum flashing current density is greater than the preset value, the polarity of voltage at the amplidyne output is reversed, and the drive motor 39 moves apart the parts 4 and 5 of the article being welded. It should be noted that this operation is performed rapidly since the amplidyne is looped in the reverse direction with a low negative feedback ratio.

The incorporation of the time derivative of the maximum flashing current density in the control law improves the dynamic stability of the welding process.

The use of the apparatus for controlling flashing speed during resistance butt welding enables concurrent welding of articles having several joints of large and different cross-sectional area. Thus, the production cost is lowered by 18 times as compared to manual arc welding, labour productivity is increased by 70 times and quality of welded articles is also improved.

What is claimed is:

1. A method for controlling flashing speed during resistance butt welding comprising measuring values of flashing current density for at least two joints of parts being welded; converting said values of current density into at least two d-c voltages and detecting the maximum value of said at least two d-c voltages; comparing said maximum d-c voltage to a preset d-c voltage, said preset voltage being proportional to a current within an admissible range of variation of the flashing current; determining a time derivative of said maximum value of said d-c voltage and using the resultant difference value between said maximum and preset voltage concurrently with said time derivative of said maximum value as parameter for controlling the flashing speed of said two joints.

2. An apparatus for controlling the flashing speed of flashing currents during resistance butt welding of a plurality of joints, said apparatus comprising: and a-c. voltage source; a group of welding transformers whose number is equal to the number of joints being welded, said transformers having primary windings connected to said a-c. voltage source and secondary winding located directly adjacent to respective joints being welded and connected thereto; a group of current transformers whose number is equal to the number of said welding transformers, said current transformers having secondary windings electrically connected to said primary windings of said welding transformers, respectively; a group of matching transformers whose number is equal to the number of said current transformers, said matching transformers having primary and secondary windings, said primary windings being connected to said secondary winding of said current transformers, respectively; circuits for conversion of the flashing currents into current density whose number is equal to the number of said matching transformers, said circuits being connected to said secondary windings of said matching transformers, respectively; a maximum signal detector having inputs whose number is equal to the number of said circuits for conversion of the flashing currents into current density; circuits for conversion of current densities into d-c. voltages whose number is equal to the number of said welding transformers, said circuit having inputs connected to the outputs of said circuits for conversion of the flashing currents into current density, respectively, and having outputs electrically connected to one another, the connected outputs forming an output of said detector the input of each of the conversion circuits representing an input of said detector; a comparison circuit for comparing a current-derived voltage value to a preset voltage value and having an output and an input electrically coupled to the output of said maximum signal detector; and a drive for displacing the parts being welded and having an electric motor connected to said output of said comparison circuit.

3. An apparatus according to claim 2, comprising a differentiating member having an input connected to the output of said maximum signal detector and an output connected to the input of said comparison circuit for comparing the current-derived voltage value to the preset voltage value.

* * * * *